United States Patent
Simic et al.

(10) Patent No.: US 7,376,206 B1
(45) Date of Patent: May 20, 2008

(54) METHOD AND APPARATUS FOR ADJUSTING THE PHASE OF A RECEIVED SIGNAL

(75) Inventors: Emilija M. Simic, La Jolla, CA (US);
Saed G. Younis, San Diego, CA (US);
Daniel F. Filipovic, Solana Beach, CA (US)

(73) Assignee: QUALCOMM Incorporated, San Diego, CA (US)

( * ) Notice: Subject to any disclaimer, the term of this patent is extended or adjusted under 35 U.S.C. 154(b) by 1306 days.

(21) Appl. No.: 09/707,458

(22) Filed: Nov. 6, 2000

(51) Int. Cl.
*H04L 27/22* (2006.01)
(52) U.S. Cl. .................................................. 375/329
(58) Field of Classification Search ................ 375/329, 375/324, 279, 284, 340, 343, 147, 150
See application file for complete search history.

(56) References Cited

U.S. PATENT DOCUMENTS

| | | | | |
|---|---|---|---|---|
| 4,831,573 A | * | 5/1989 | Norman ....................... | 708/230 |
| 5,579,346 A | * | 11/1996 | Kanzaki ...................... | 375/344 |
| 6,134,430 A | * | 10/2000 | Younis et al. ............... | 455/340 |
| 6,285,655 B1 | * | 9/2001 | Lundby et al. ............. | 370/209 |
| 6,567,833 B2 | * | 5/2003 | van Wechel et al. ........ | 708/622 |

FOREIGN PATENT DOCUMENTS

| | | |
|---|---|---|
| EP | 0896458 | 2/1999 |
| GB | 2345619 | 7/2000 |
| JP | 11261527 | 9/1999 |

\* cited by examiner

*Primary Examiner*—Khanh C. Tran
(74) *Attorney, Agent, or Firm*—Timothy Loomis; Larry J. Moskowitz; Thomas R. Rouse

(57) ABSTRACT

Techniques to rotate the phase of a received signal to compensate for phase change or discontinuity introduced by circuit elements located directly in the receive signal path. One or more control signals are received, with each control signal being provided to adjust a particular characteristic of one or more circuit elements associated with the receive signal path. A phase rotation corresponding to an operating state defined by the control signals is then determined, and the phase of the received signal is rotated by an amount related to the determined phase rotation. In some designs, the phase rotation is performed on digitized inphase $I_{IN}$ and quadrature $Q_{IN}$ samples to generate phase rotated $I_{ROT}$ and $Q_{ROT}$ samples. The phase rotation can be performed by a complex multiply (after DC offset compensation) and, for ease of implementation, can be performed digitally in discrete increments (e.g., 90° increments).

21 Claims, 8 Drawing Sheets

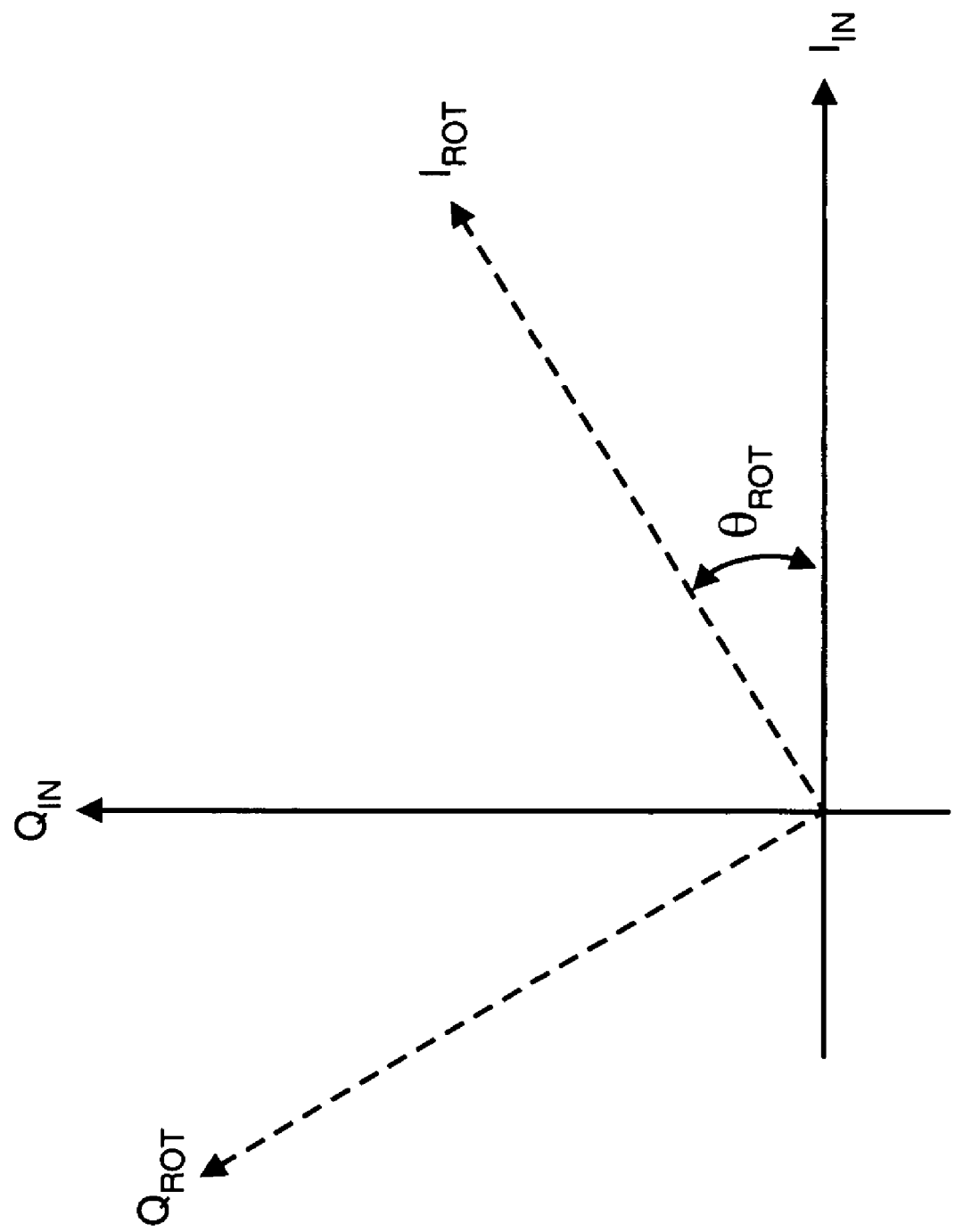

METHOD AND APPARATUS FOR ADJUSTING THE PHASE OF A RECEIVED SIGNAL

BACKGROUND OF THE INVENTION

I. Field of the Invention

The present invention relates to data transmissions. More particularly, the present invention relates to method and apparatus for adjusting the phase of a received signal to account for phase shifts and discontinuities experience by the signal.

II. Description of the Related Art

In a typical RF communications system, data is proceed at a transmitter device, modulated, filtered, amplified, and transmitted to one or more receiver devices. The transmitted signal typically experiences path loss, multipath, and other phenomena prior to reaching the receiver devices. At a receiver device, the modulated signal is received, conditioned, and demodulated to recover the transmitted data. The signal conditioning typically includes low noise amplification, filtering, automatic gain control, frequency downconversion, sampling, quantization, and so on.

Due to path loss, multipaths that may add constructively or destructively, and other phenomena, the signal level of the received signal typically varies over a wide rang of values. For example, for a CDMA system, the received signal may vary over 85 dB. To provide a signal having the proper level for sampling and quantization, multiple gain stages are usually employed in the received signal path. These gain stages may include one or more variable gain amplifiers (VGAs) having gains that can be adjusted by control signals. The receive signal path may also include one or more sections in which the received signal can be routed through one of several signal paths (e.g., a gain path and a bypass path).

The characteristics of the received signal can change as the variable circuit elements in the receive signal path are adjusted or as different signal paths are selected. In particular, the phase of the received signal can shift as the circuit elements are adjusted. The received signal can have phase discontinuities if the circuit elements are adjusted in a step-wise fashion or if the signal is switched through different signal paths. The phase shifts and discontinuities can cause performance degradation.

Conventionally, changes to the phase of the received signal are maintained at acceptable levels by proper design and operation of the circuit elements in the receive signal path. For example, some conventional designs limit the rate at which the circuit elements and signal paths can be switched. These limitations allow the loops in the receive signal path to better track the changes, thereby reducing the amount of degradation. However, these limitations also prevent the receiver device from tracking fast changes in the received signal, which may also degrade performance. Furthermore, in CDMA systems, these limitations may also adversely affect the initial transmit power level.

As can be seen, techniques for adjusting the phase of a received signal to compensate for phase shifts and/or discontinuities due to adjustments and/or switching of circuit elements associated with the receive signal path are highly desirable.

SUMMARY OF THE INVENTION

The present invention provides techniques to adjust the phase of a received signal to compensate for phase shift introduced by circuit elements associated with the receive signal path. By rotating the phase of the received signal by an amount related to, and approximately concurrently with, the phase shift introduced by the circuit elements, phase shift and discontinuity in the received signal is reduced. The phase rotation can be performed at various locations along the receive signal path. In some embodiments, the phase rotation is performed digitally by rotating digitized samples (if the rotation is performed outside DC correction loops). The phase rotation can be applied to the received signals in any communications system, particularly systems in which a pilot is transmitted with the data.

An embodiment of the invention provides a method for rotating the phase of a received signal. In accordance with the method, one or more control signals is received, with each control signal being provided to adjust a particular characteristic of one or more circuit elements associated with the receive signal path. A phase rotation corresponding to an operating state defined by the control signals is then determined, and the phase of the received signal is rotated by an amount related to the determined phase rotation. The phase rotation is typically performed at a designated time such that phase shift or discontinuity in the received signal is reduced when the circuit elements are adjusted.

In some receiver designs, the received signal is quadrature downconverted and digitized to provide inphase ($I_{IN}$) and quadrature ($Q_{IN}$) samples, and the phase rotation is performed on the $I_{IN}$ and $Q_{IN}$ samples to generate phase rotated $I_{ROT}$ and $Q_{ROT}$ samples. The resolution of the $I_{ROT}$ and $Q_{ROT}$ samples can be maintained the same (e.g., four bits of resolution) as that of the $I_{IN}$ and $Q_{IN}$ samples.

The phase rotation can be advantageously performed to reduce the amount of phase discontinuity introduced when the received signal is switched between signal paths or circuit settings. The phase rotation is performed by a complex multiply and, for ease of implementation, is performed digitally in discrete increments (e.g., 90° increments). The phase rotation can be used to account for phase change or discontinuity introduced by circuit elements located directly in the receive signal path.

Another embodiment of the invention provides a receiver unit that includes a receiver, a controller, and a phase rotator. The receiver receives and conditions a received signal in accordance with one or more control signals to generate a conditioned signal. The receiver includes one or more circuit elements having one or more characteristics that are adjustable by the control signals. The controller determines a phase rotation corresponding to an operating state defined by the control signals, and the phase rotator receives and rotates the phase of the conditioned signal by an amount related to the determined phase rotation.

The receiver may include one or more sections, with each section having a number of signal paths and each signal path being associated with a particular phase. Control signals are then provided to switch the received signal through the signal paths.

In some implementations, the receiver downconverts and digitizes the conditioned signal to provide $I_{IN}$ and $Q_{IN}$ samples, and the phase rotator rotates the phase of the $I_{IN}$ and $Q_{IN}$ samples to generate phase rotated $I_{ROT}$ and $Q_{ROT}$ samples. The receiver unit can further include a demodulator that processes the $I_{ROT}$ and $Q_{ROT}$ samples to provide pilot symbols and data symbols and further coherently demodulates the data symbols with the pilot symbols to generate recovered data.

The phase rotator can be designed to provide phase rotation in discrete increments (e.g., 90° increments). In a specific design, the phase rotator includes tow sets of multiplexers and two sets of exclusive-OR gates. The first set of multiplexers receives the $I_{IN}$ and $Q_{IN}$ samples and provides either the $I_{IN}$ or $Q_{IN}$ samples depending on a first signal. The first set of exclusive-OR gates couples to the first set of multiplexers and selectively inverts the received samples based on a second signal. The second set of multiplexers receives the $Q_{IN}$ and $I_{IN}$ samples and provides either the $Q_{IN}$ or $I_{IN}$ samples depending on a first signal. The second set of exclusive-OR gates couples to the second set of multiplexers and selectively inverts the received samples based on a third signal. The outputs from the first and second sets of exclusive-OR gates comprise the $I_{ROT}$ and $Q_{ROT}$ samples, respectively.

The invention can be extended to provide phase adjustment of a transmit signal in systems with pilot assisted coherent reverse link (e.g., IS-95C) to compensate for phase shifts introduced by the circuit elements in the transmit path that have discrete gain steps (e.g., driver and/or step-gain power amplifier), or if the signal is switched through different signal paths (e.g., between a bypass or power amplifier path).

BRIEF DESCRIPTION OF THE DRAWINGS

The features, nature, and advantages of the present invention will become more apparent from the detailed description set forth below when taken in conjunction with the drawings in which like reference characters identify correspondingly throughout and wherein:

FIG. 5 is a diagram that illustrates the phase rotation of the $I_{IN}$ and $Q_{IN}$ samples;

DETAILED DESCRIPTION OF THE SPECIFIC EMBODIMENTS

Figure 1:
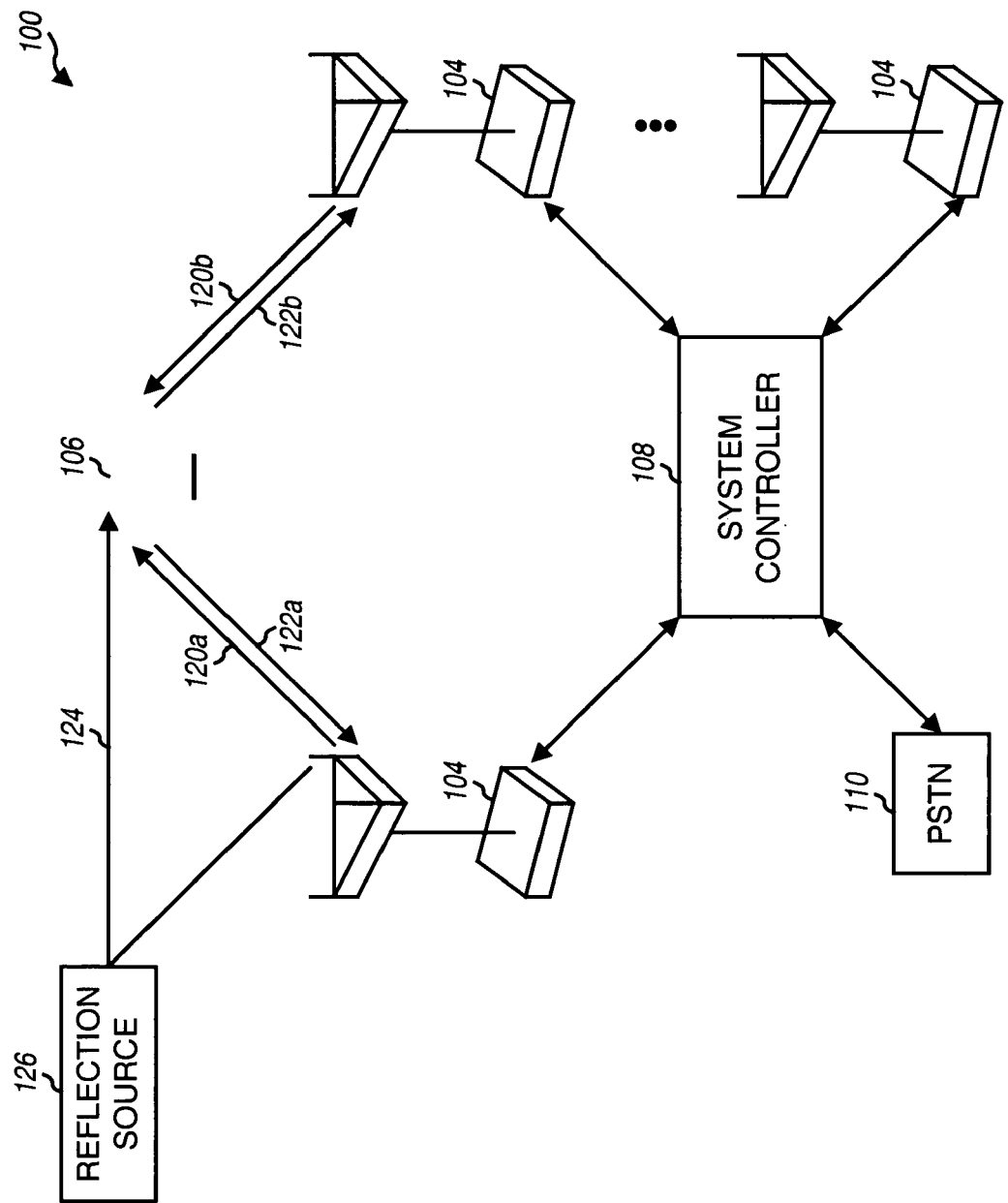
FIG. 1 is a diagram of a communication system in which the present invention may be implemented.

FIG. 1 is a diagram of a communication system 100 in which the present invention may be implemented. Communications system 100 can be a code division multiple access (CDMA) system, a time division multiple access (TDMA) communications system (e.g., a GSM system), a frequency division multiple access (FDMA) communications system, or other multiple access communications system that supports voice and data communication between users over a terrestrial link.

CDMA systems are typically designed to conform to one or more standards such as the "TIA/EIA/IS-95-A Mobile Station-Base Station Compatibility Standard for Dual-Mode Wideband Spread Spectrum Cellular System" (hereinafter referred to as the IS-95-A standard), the "TIA/EIA/IS-98 Recommended Minimum Standard for Dual-Mode Wideband Spread Spectrum Cellular Mobile Station" (hereinafter referred to as the IS-98 standard), the standard offered by a consortium named "3rd Generation Partnership Project" (3GPP) and embodied in a set of documents including Document Nos. 3G TS 25.211, 3G TS 25.212, 3G TS 25.213, and 3G TS 25.214 (hereinafter referred to as the W-CDMA standard), and the "TIA/EIA/IS-2000.2-A TR-45 Physical Layer Standard for cdma200 Spread Spectrum Systems" (hereinafter referred to as the CDMA-2000 standard). New CDMA standards are continually proposed and adopted for use.

In FIG. 1, a number of base stations 104 are in communication with a number of terminals 106 (only one terminal 106 is shown in FIG. 1 for simplicity). A system controller 108 couples to base stations 104 in the communications system and may further couple to a public switched telephone network (PSTN) 110. System controller 108 coordinates the communication among users coupled to PSTN 110 and users at terminals 106.

Data transmissions from base stations 104 to terminal 106 occur on the forward link through signal paths 120, and data transmissions from terminal 106 to base stations 104 occur on the reverse link through signal paths 122. The signal path can be a straight path, such as signal path 120a, or a reflected path, such as signal path 124. Reflected path 124 is created when the signal transmitted from base station 104a is reflected off reflection source 126 and arrives at terminal 106 through a different path than the straight path. Reflection source 126 is typically an artifact in the environment in which terminal 106 operates, and may be a building, a mobile, or other structure.

Figure 2:
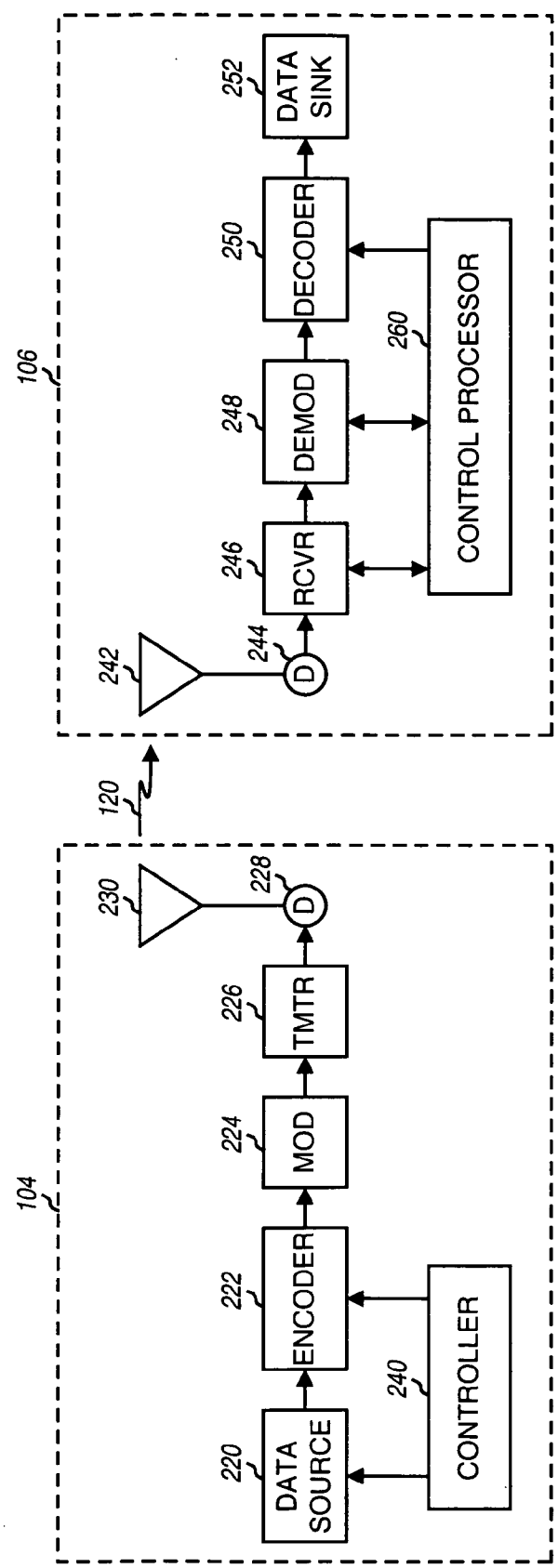
FIG. 2 is a block diagram of an embodiment of the signal processing at a base station and a terminal for a forward link data transmission.

FIG. 2 is a block diagram of an embodiment of the signal processing at base station 104 and terminal 106 for a forward link data transmission. At base station 104, a data source 220 provides data, typically in packets, to an encoder 222 that performs a number of functions, depending on the particular CDMA system or standard being implemented. Such encoding functions typically include formatting each data packet with the necessary control fields, cyclic redundancy check (CRC) bits, and code tail bits. Encoder 222 then encodes one or more formatted packets with a particular coding scheme (e.g., a particular convolutional or Turbo code), performs rate matching of the encoded packet (e.g., by repeating or puncturing the code symbols), and interleaves (i.e., recorders) the symbols within the packets. The interleaved data is then provided to a modulator (MOD) 224.

For the IS-95 system, within modulator 224, the interleaved data is scrambled by a long PN code that identifies the terminal for which the data is transmitted, covered with a Walsh code corresponding to the traffic channel assigned for the data transmission, and further spread with short PNI and PNQ spreading codes. The spread data is then provided to a transmitter (TMTR) 226 and filtered, modulated, and amplified to generate a modulated signal. The modulated signal is routed through duplexer 228 and transmitted from antenna 230 on the forward link through signal path 120. The forward link signal processing is described in further detail in the CDMA standards identified above.

At terminal 106, the modulated signal is received by an antenna 242, routed through a duplexer 244, and provided to a receiver (RCVR) 246. Within receiver 246, the received signal is amplified, filtered, quadrature demodulated, sampled, and quantized to generate inphase ($I_{IN}$) and quadrature ($Q_{IN}$) samples. The digitized $I_{IN}$ and $Q_{IN}$ samples are provided to a demodulator (DEMOD) 248 and demodulated in accordance with the particular standard or system being implemented.

For the IS-95 system, within demodulator 248, the $I_{IN}$ and $Q_{IN}$ samples are despreaded with the short PN codes, decovered with the Walsh code corresponding to the traffic channel being processed, and descrambled with a descrambling code. The despreading, Walsh, and descrambling codes used at the terminal correspond to the codes used at the base station for the data transmission being processed. The demodulated data from demodulator 248 is provided to a decoder 250 that performs the inverse of the functions performed at encoder 222 (e.g., the de-interleaving, decoding, and CRC check functions). The decoded data is then provided to a data sink 252. A control processor 260 can direct the operation of receiver 246, demodulator 248, and decoder 250.

The hardware, as described above, supports transmissions of packet data, messaging, voice, video, and other types of communication on the forward link. A bi-directional communications system also supports data transmissions on the reverse link from the terminal to the base station. However, the reverse link processing is not shown in FIG. 2 for simplicity.

Figure 3:
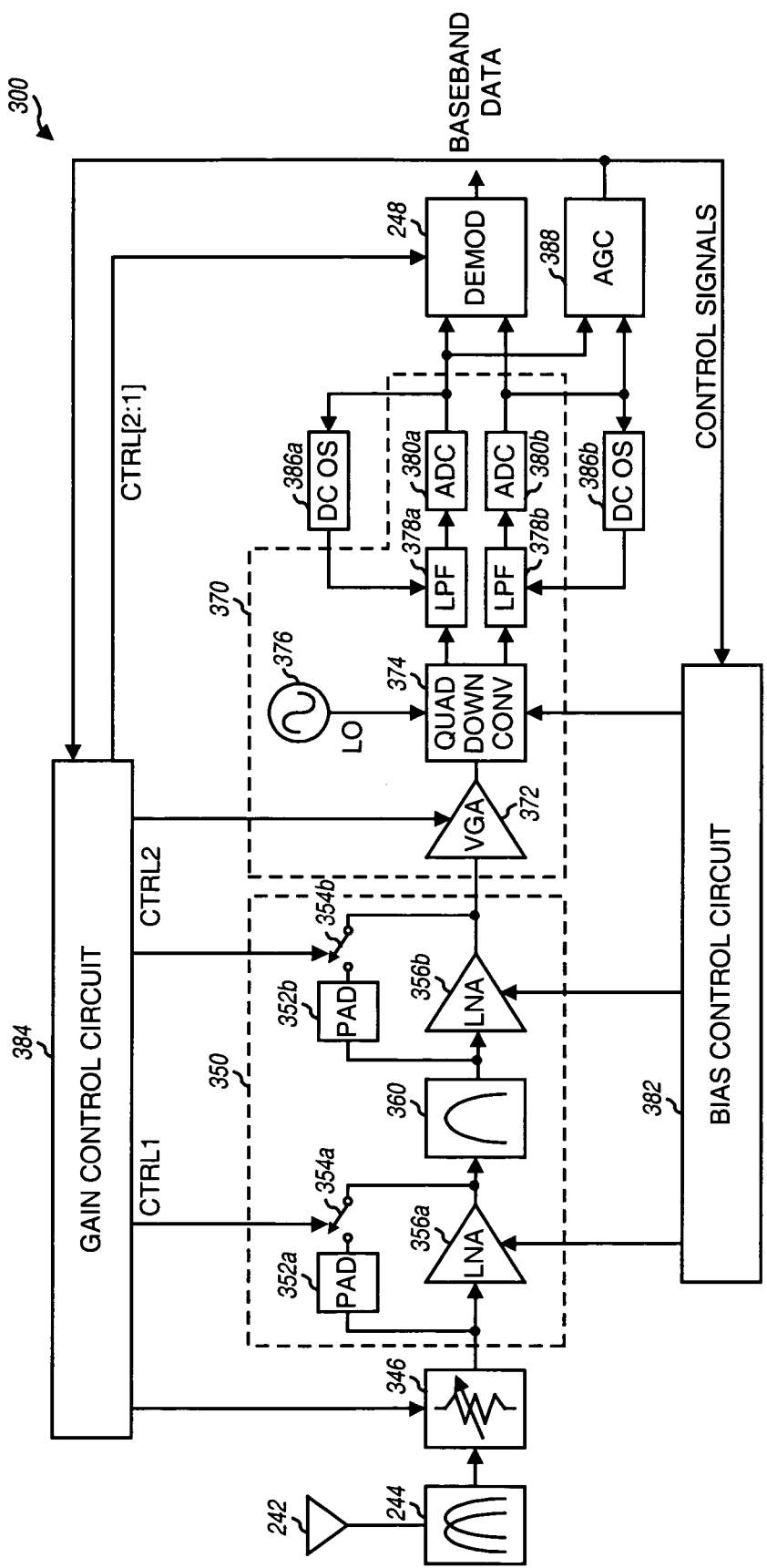
FIG. 3 is a block diagram of a specific embodiment of a receiver suitable for processing a modulated signal.

FIG. 3 is a block diagram of a specific embodiment of a receiver 300 suitable for processing a modulated signal. Receiver 300 can be used as receiver 246 in FIG. 2. The modulated signal is received by antenna 242, routed through duplexer 244, attenuated by an attenuator 346 within receiver 300, and provided to an RF processing section 350. Within RF processing section 350, the attenuated signal is processed by one of two signal paths in the first gain block. The first signal path includes a pad 352a coupled in series with a switch 354a and the second path includes a low noise amplifier (LNA) 356a. The output from the first gain block is filtered by a bandpass filter 360 to remove noise and spurious signals that can cause intermodulation products in the subsequent signal processing stages. The filtered signal is then processed by one of two signal paths in the second gain block, with the first signal path including a pad 352b coupled in series with a switch 354b and the second signal path including a LNA 356b.

Within each gain block, the first signal path provides a bypass path for the gain block and pad 352 provides a particular amount of attenuation. LNA 356 in the second signal path amplifies the received signal by a particular gain to provide signal gain for the gain block. Switch 354 selects the bypass path when the gain of LNA 356 is not needed. LNA 356 can also be disabled, for example, by controlling its bias current. In another embodiment, LNA 356a may have two or more discrete gain steps.

The signal from the second gain block of RF processing section 350 is provided to an IF processing section 370. Within IF processing section 370, the signal is amplified by a variable gain amplifier (VGA) 372 to provide a signal having the desired signal level. The signal is then provided to a quadrature downconverter 374 and quadrature downconverted with the carrier signals (i.e., LO) from an oscillator 376 to provide inphase (I) and quadrature (Q) baseband signals. The I and Q baseband signals are then filtered by lowpass filters (LPFs) 378a and 378b, respectively, to remove spurious signals and out-of-band noise. The filtered I and Q signals are then digitized by analog-to-digital converters (ADCs) 380a and 380b, respectively, to provide the digitized $I_{IN}$ and $Q_{IN}$ samples.

In an embodiment, the digitized $I_{IN}$ and $Q_{IN}$ samples are respectively provided to I and Q DC offset control loops 386a and 386b that detect the average offsets of the I and Q components, respectively. The average offsets are then fed back to lowpass filters 378a and 378b, respectively, to reduce the digital I and Q channel offset for efficient demodulation.

VGA 372 provides a variable gain such that the amplitude of the signals provided to ADCs 380 is at the desired level. Additional or alternative VGAs may also be provided in the receive signal path. For example, VGA 372 may be replaced (or supplemented) by a pair of VGAs coupled between lowpass filters 378 and ADCs 380.

An automatic gain control (AGC) circuit 388 provides control signals to a bias control circuit 382 and a gain control circuit 384. Bias control circuit 382 provides bias current and/or voltages to LNAs 356a and 356b such that the required performance (e.g., linearity) is achieved. Bias control circuit 382 may also disable the LNAs when the gain path is not needed. Gain control circuit 384 provides the control signals for attenuator 346, switches 354a and 354b, and VGA 372. Gain control circuit 384, in conjunction with bias control circuit 382, selects either the first or second signal path of each gain block to process the received signal.

Figure 4A:
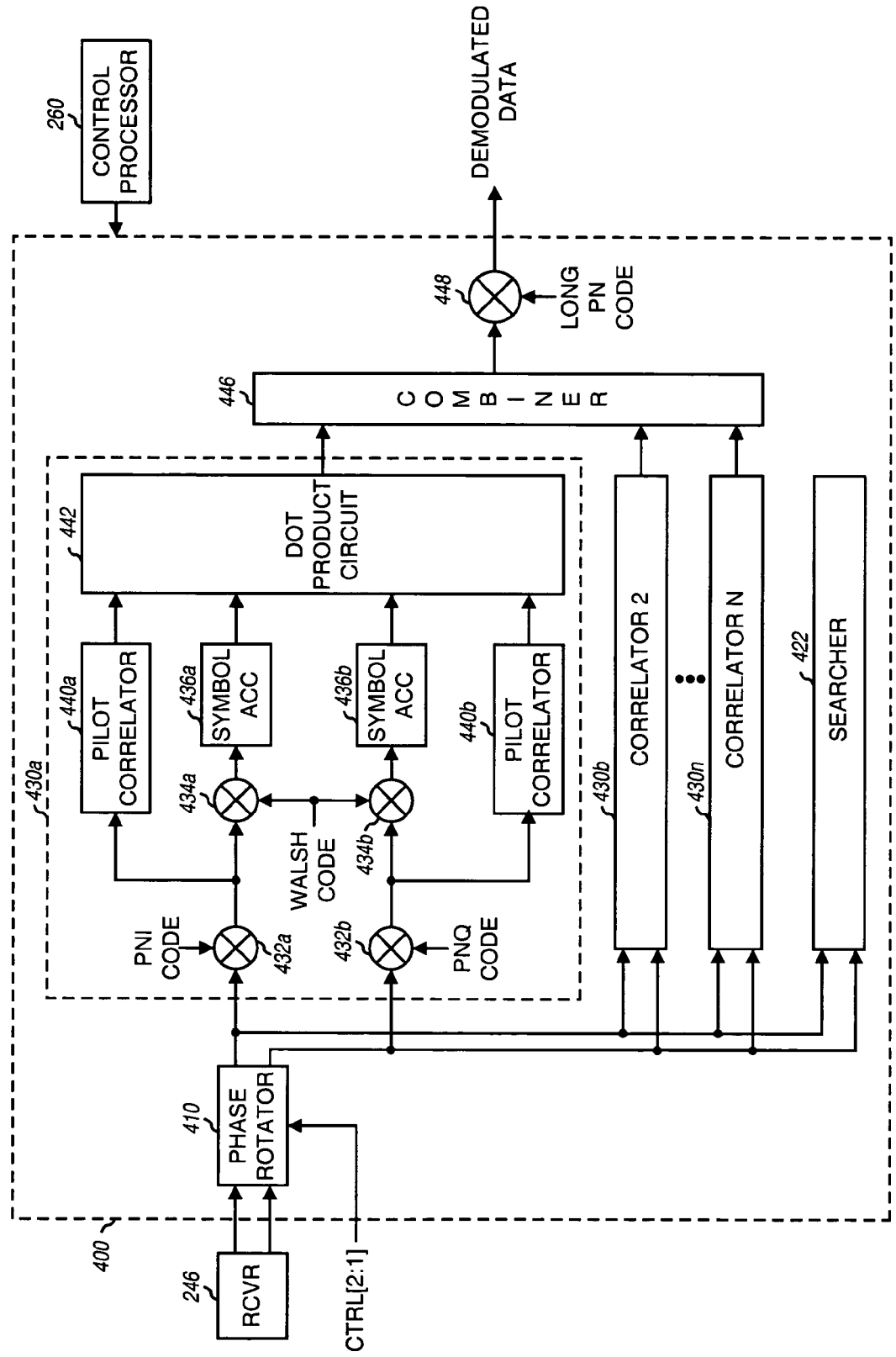
FIG. 4A is a block diagram of a specific embodiment of a demodulator suitable for demodulating the received signal and including a phase rotator of the invention.

FIG. 4A is a block diagram of a specific embodiment of a demodulator 400 suitable for demodulating the received signal and including a phase rotator of the invention. Demodulator 400 can be used as demodulator 248 in FIG. 2. Within demodulator 400, the $I_{IN}$ and $Q_{IN}$ samples from receiver 246 are provided to a phase rotator 410 that rotates the phase of the samples in a manner described below. The phase rotated $I_{ROT}$ and $Q_{ROT}$ samples are then provided to a rake receiver. Although a rake receiver is shown in FIG. 4A for processing the received signal, other receiver structures and implementations can also be used and are within the scope of the present invention.

As shown in FIG. 4A, the rake receiver includes a searcher element 422 and a number of correlator elements 430a through 430n (which are also referred to as fingers of the rake receiver). Searcher element 422 and correlator elements 430 each receives the $I_{ROT}$ and $Q_{ROT}$ samples from phase rotator 410 and performs the tasks associated with the element or as directed by a control processor 260. For example, searcher element 422 may be instructed by control processor 260 (or assigned) to search for strong instances of the received signal. The strong signal instances may be present at different time offsets, and can be identified by searcher element 422 by processing the $I_{ROT}$ and $Q_{ROT}$ samples with different sets of parameters (e.g., different PN codes, different time offsets, and so on). Searcher 422 may be designed to provide data corresponding to the searched signal or an indication of the search result to control processor 260. Control processor 260 assigns correlator elements 430 to demodulate the strongest instances of the received signal, as determined with the assistance of searcher element 422. The strongest signal instances can correspond to different signal paths from the same source, or different transmissions from different sources, or both.

Each assigned correlator element 430 performs demodulation, as directed by control processor 260, of one instance of the received signal (i.e., a signal for a particular traffic channel at a particular assigned time offset). For the IS-95 CDMA system, within each assigned correlator element 430, the $I_{ROT}$ and $Q_{ROT}$ samples are despread with the short PNI and PNQ codes by multipliers 432a and 432b, respectively. Each correlator element 430 is typically assigned the short PNI and PNQ codes having a unique offset corresponding to the propagation delay experienced by the signal instance being demodulated. The despread I and Q samples are then decovered (i.e., multiplied) by multipliers 434a and 434b, respectively, with the Walsh code corresponding to the traffic channel being processed. The outputs from multipliers 434a and 434b are provided to symbol accumulators 436a and 436b, respectively, and accumulated over the length of the Walsh symbol (i.e., over the Walsh symbol period of 64 chips for the IS-95 system) to generate the decovered I and Q symbols.

For some communications systems such as the IS-95 CDMA system and the W-CDMA system, a pilot is transmitted with the data to enable the receiver device to coherently demodulate the data. For the IS-95 CDMA system, pilot data (comprised of a sequence of all zeros) is transmitted on traffic channel 0 and covered with the all zero sequence corresponding to Walsh code 0. The despread I and Q samples from multipliers 432a and 432b contain pilot data and are provided to pilot correlators 440a and 440b, respectively, that perform pilot decovering, symbol accumulation, and lowpass filtering of the despread I and Q samples to recover the pilot.

Figure 4B:
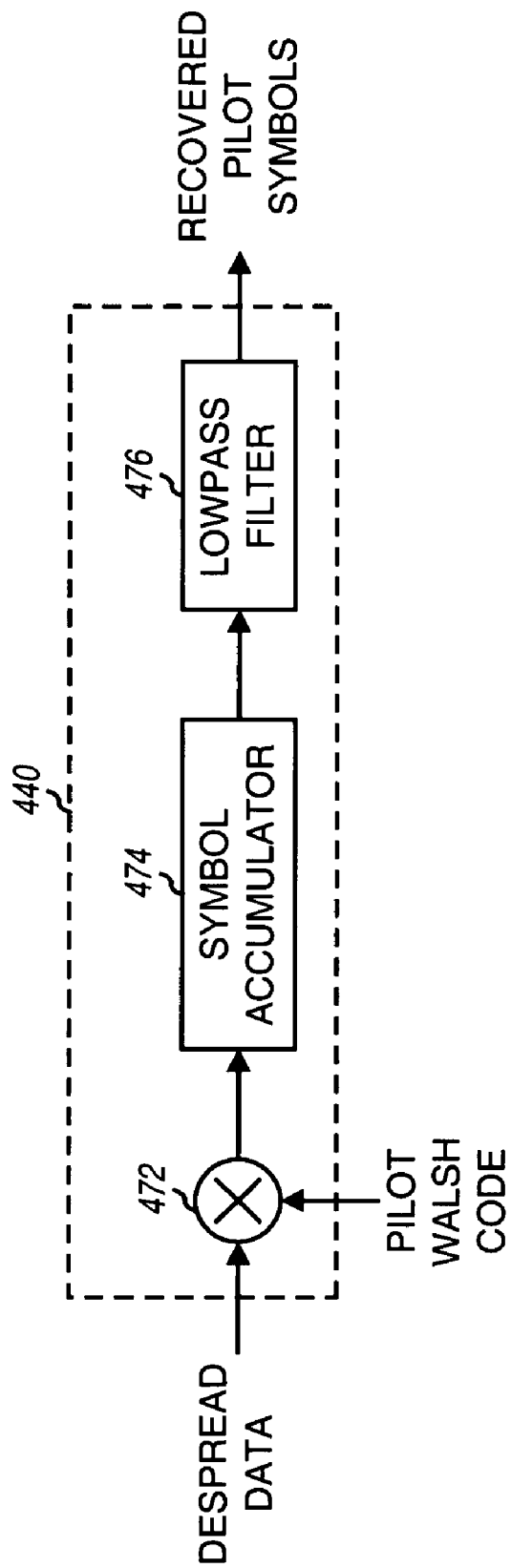
FIG. 4B is a block diagram of an embodiment of a pilot correlator within the demodulator.

FIG. 4B is a block diagram of an embodiment of pilot correlator 440. The despread samples from one multiplier 432 are provided to a multiplier 472 and decovered with the pilot Walsh sequence (e.g., typical Walsh code 0 for the IS-95 CDMA system). The decovered samples are provided to a symbol accumulator 474 and accumulated over the length of the pilot Walsh sequence (e.g., 64 chips in duration for the IS-95 Walsh sequence). The accumulated output is provided to a lowpass filter 476 and filtered to remove noise. The output from lowpass filter 476 comprises the recovered pilot symbols.

Referring to FIG. 4A, the decovered data symbols from symbol accumulators 436a and 436b and the recovered pilot symbols from pilot correlators 440a and 440b are provided to a dot product circuit 442, which computes the dot product of pairs of vectors corresponding to the pilot and data symbols. The pilot recovered by each correlator element 430 is indicative of the strength of the signal instance being processed by that correlator element. The pilot is thus used to phase demodulate the data and to scale the data in accordance with the strength of the received pilot. For each complex symbol, dot product circuit 442 projects the vector corresponding to the complex data symbol (i.e., the decovered I and Q symbols) onto the vector corresponding to the complex pilot symbol (i.e., the recovered $P_I$ and $P_Q$ symbols), multiplies the amplitude of the vectors, and provides a signed scalar value indicative of the energy of the recovered symbol.

A combiner 446 receives the scalar values from correlator elements 430 that have been assigned to process various signal instances, coherently combines the scalar values, and generates recovered symbols. Coherent combination takes into account the sign of the scalar values from each correlator element 430 and results in a maximal ratio combining of the signals received from different signal paths. For the IS-95 CDMA system, the recovered symbols from combiner 446 are descrambled by a multiplier 448 with a descrambling code (e.g., the long PN code) to provide demodulated data that is subsequently decoded by decoder 250.

Referring back to FIG. 3, the received signal can be provided through one of two signal paths in each of the first and second gain blocks. Each signal path in each gain block is associated with a particular phase. The phases of the two signal paths in a particular gain block are not likely to be equal, and the phase difference is reflected in the received signal as the signal paths are switched. In particular, when the two signal paths are switched, the received signal can experience a phase discontinuity.

The received signal includes the pilot and the data. For coherent demodulation, the phase of the recovered pilot is used to demodulate the decovered data to provide recovered data. When a phase discontinuity exists in the received signal, the phases of the pilot and the data are similarly affected.

The pilot is typically filtered by a lowpass filter (such as lowpass filter 476 in FIG. 4B) having a bandwidth selected to remove a large amount of noise while allowing for tracking of changes in the phase/frequency of the pilot. In a specific design, the pilot lowpass filter is a first order infinite impulse response (IIR) filter having a time constant ($\tau_P$) of approximately 417 μsec.

Referring to FIG. 4A, a phase change or discontinuity in the received signal is reflected almost immediately thereafter in the decovered data symbols from symbol accumulators 436 because lowpass filters are not used in the data recovery path. However, because of pilot lowpass filter 476 in FIG. 4B, the phase change or discontinuity in the receive signal path is not reflected in the recovered pilot symbols from lowpass filter 476 until several filter time constants later. During the time period before lowpass filter 476 settles to reflect the phase change or discontinuity, a phase error exists between the pilot symbols and the data symbols. The magnitude of the phase error is related to the phase difference, for example, between the two signal paths being switched (e.g., between the bypass path and the LNA path in each gain block in FIG. 3) or between two settings of a particular circuit element (e.g., between high gain and low gain of LNA 356a). This phase error is manifested in the demodulated data from demodulator 400. If the phase error is large, the data may be decoded in error. An entire frame of decoded data may be deemed in error and declared erased even if only some of the data bits are decoded in error.

In one conventional method for mitigating the number of frame erasures (i.e., frames decoded in error) due to phase error caused by switching between signal paths and circuit settings, the switching rate is limited to a low value (e.g., 125 Hz, or 80 msec). The low switching rate ensures that even if a particular frame is decoded in error because of phase change or discontinuity, the next several frames will not be erased because of the switching between signal paths or circuit settings.

However, limiting the switching rate between signal paths and circuit setting can create other problems. For example, limiting the switching rate may prevent the receiver device from tracking fast changes in the level of the received signal. In certain instances, after switching from the LNA path to the bypass path, the received signal level may quickly decrease to a low level requiring additional gain from the LNA. The quick change in signal level may be due to multipath, and the VGA gain may not be adequate to compensate for the reduced signal level. If switching back to the LNA path is prevented for a particular time period (e.g., 80 msec, corresponding to 125 Hz), the received signal may become so weak that the data may be received in error and a frame erasure may occur. In addition, in CDMA systems, the initial loop transmit estimate, since it is based on the received signal, may be in error by the amount of the missing LNA gain.

In an embodiment of the invention, a phase rotator is used to compensate for a phase change or discontinuity in the received signal due to, for example, switching between signal paths or between settings of a circuit element. Referring to FIG. 4A, phase rotator 410 receives the $I_{IN}$ and $Q_{IN}$ samples from receiver 246, performs phase rotation of the received samples based on the control signals CTRL[2:1], and provides the $I_{ROT}$ and $Q_{ROT}$ samples having a phase that is rotated relative to that of the $I_{IN}$ and $Q_{IN}$ samples. The phase rotation approximately compensates for the phase difference between the signal paths or circuit settings being switched.

Several factors and considerations are typically addressed in the design of phase rotator 410. First, the phase rotator should provide the required precision (i.e., the required amount of rotation) necessary to compensate for the phase changes and discontinuities expected for the received signal. Second, the phase rotator should be simple to implement and cost effective. Third, it is preferable that the phase rotator does not generate additional bits of resolution, which may impact the designed of subsequent processing blocks. In some conventional receiver designs, the $I_{IN}$ and $Q_{IN}$ samples each have four bits of resolution. Thus, if the $I_{ROT}$ and $Q_{ROT}$ samples can also be maintained at four bits of resolution (without sacrificing accuracy), the subsequent processing blocks need not be modified to operate on the $I_{ROT}$ and $Q_{ROT}$ samples.

The inventors have discovered, based on empirical measurement, that degradation in performance can be reduced and conformance to design specifications can be achieved if the phase difference between the signal paths or circuit settings being switched is limited to a particular amount that is dependent on the switching rate. Table 1 lists the switching rate and the maximum phase difference between signal paths or circuit settings that can be tolerated without noticeable performance degradation. As can be observed from Table 1, up to 160° of phase difference can be tolerated for switching rate of up to 50 Hz, up to 90° of phase difference can be tolerated for switching rate of up to 150 Hz, and up to 60° of phase difference can be tolerated for switching rate of up to 700 Hz.

TABLE 1

| Switching rate | Tolerable Phase Difference |
| --- | --- |
| ≦50 Hz | 160° |
| 50-150 Hz | 90° |
| 150-700 Hz | 60° |

The inventors have also discovered that the phase difference between signal paths and circuit settings varies by approximately 3° over a temperature range of −40° C. to +80° C., by approximately 4° over the system operating bandwidth (e.g., from 869 MHz to 894 MHz), and by approximately 2° from receiver unit to receiver unit. Thus, the variations in the phase difference over operating conditions and component tolerance can be expected to be less than 10°. Based on the above observations and for a switching rate of 700 Hz or less, a phase rotator that can provide phase rotation in 90° increments can provide the required performance.

FIG. 5 is a diagram that illustrates the phase rotation of the $I_{IN}$ and $Q_{IN}$ samples. The $I_{IN}$ and $Q_{IN}$ samples (i.e., the inputs to the phase rotator) are shown as solid phasors on the horizontal and vertical axes, respectively. The $I_{ROT}$ and $Q_{ROT}$ samples (i.e., the outputs from the phase rotator) are shown as dashed phasors. The phase difference between the phase rotator outputs and the phase rotator inputs is a phase rotation of $\theta_{ROT}$. The $I_{ROT}$ and $Q_{ROT}$ samples can be computed as:

$$I_{ROT}=I_{IN}\bullet\cos(\theta_{ROT})+Q_{IN}\bullet\sin(\theta_{ROT}), \text{ and} \qquad \text{Eq (1)}$$

$$Q_{ROT}=-I_{IN}\bullet\sin(\theta_{ROT})+Q_{IN}\bullet\cos(\theta_{ROT}). \qquad \text{Eq (2)}$$

Different bypass architectures or devices can be used that may have different phase shifts over temperature and/or bandwidth. In this case, it should be recognized that a phase rotation table may be expanded to include temperature and/or bandwidth variations.

In some embodiments, the phase rotator can be designed to provide phase rotation in 90° increments, as determined by the signals ROT[2:1]. Table 2 lists the phase rotation associated with four possible values of the signals ROT[2:1]. Table 2 also lists the generation of the phase rotated $I_{ROT}$ and $Q_{ROT}$ samples based on the $I_{IN}$ and $Q_{IN}$ samples.

TABLE 2

| ROT[2:1] | Phase Rotation $\theta_{ROT}$ | $I_{ROT}$ | $Q_{ROT}$ |
| --- | --- | --- | --- |
| 0 0 | 0° | $I_{IN}$ | $Q_{IN}$ |
| 0 1 | 90° | $Q_{IN}$ | $-I_{IN}$ |
| 1 0 | 180° | $-I_{IN}$ | $-Q_{IN}$ |
| 1 1 | 270° | $-Q_{IN}$ | $I_{IN}$ |

A specific implementation of the invention is now described for receiver 300 shown in FIG. 3 in which two control signals CTRL[2:1] are provided for the two gain blocks in the receive signal path. One control signal (i.e., CTRL1) selects either bypass path or the LNA path of the first gain block, and the other control signal (i.e., CTRL2) selects either the bypass path or the LNA path of the second gain block. Each set of values for the control signals CTRL[2:1] defines a particular operating state of the receive signal path. For example, the values of CTRL[2:1]=00 can define the use of the bypass paths in both gain blocks, the values of CTRL[2:1]=01 is not used in this specific example (i.e., this operating state is forbidden), the values of CTRL[2:1]=10 can define the use of the bypass path in the first gain block and the LNA path in the second gain block, and the values of CTRL[2:1]=11 can define the use of the LNA paths in both gain blocks.

Each operating state can be associated with a particular phase rotation of the received signal. One of the operating states (e.g., CTRL[2:1]=00) is designated as the baseline state having a phase rotation of zero. The remaining operating states are each associated with a particular phase rotation relative to the baseline state. Each operating state (i.e., each set of values for CTRL[2:1]) is mapped to corresponding values for ROT[2:1] that most closely matches the phase associated with that operating state.

As an example, the LNA path in the first gain block can have 110° of phase shift relative to the bypass path, and the LNA path in the second gain block can have 150° of phase shift relative to the bypass path. The phase is thus 0° for CTRL[2:1]=00 when the bypass paths are used for both gain blocks, 150° for CTRL[2:1]=10 when the bypass path is used for the first gain block and the LNA path is used for the second gain block, and 260° for CTRL[2:1]=11 when the LNA paths are used for both gain block. The phase rotation is performed counter clockwise to compensate for the change or discontinuity in the phase of the received signal as one or more signal paths are switched CTRL[2:1]=00 (i.e., phase shift of 0°) is thus associated with ROT[2:1]=00 (i.e., phase rotation of 0°), CTRL[2:1]=10 (i.e., phase shift of 150°) is associated with ROT[2:1]=10 (i.e., phase rotation 180°), and CTRL[2:1]=11 (i.e., phase shift of 260°) is associated with ROT[2:1]=01 (i.e., phase rotation 270°).

Other phase differences between the signal paths may result in different association between CTRL[2:1] and ROT[2:1].

When the receive signal path is adjusted or switched to a new operating state, the phase rotation associated with the new operating state is determined. The phases of the $I_{IN}$ and $Q_{IN}$ samples are then rotated by the determined phase rotation to compensate for the phase shift or discontinuity due to the receive signal path operating the new operating state. The $I_{IN}$ and $Q_{IN}$ samples are rotated at approximately the same time that the signal paths or circuit settings are switched. By rotating the phases of the $I_{IN}$ and $Q_{IN}$ samples by the required amount in the opposite direction and at approximately the same time, phase change or discontinuity in the received signal is reduced and performance is improved.

When a new operating state is selected (as identified by the control signals CTRL[2:1]) the phase rotation associated with this new operating state is determined (as identified by the signals ROT[2:1]). The mapping of operating states to the required phase rotations can be achieved with a look-up table (LUT), combinatorial logic, or other implementations. The $I_{IN}$ and $Q_{IN}$ samples are then adjusted, as required and by the amount identified by the signals ROT[2:1] to provide the desired phase rotation.

Figure 6:
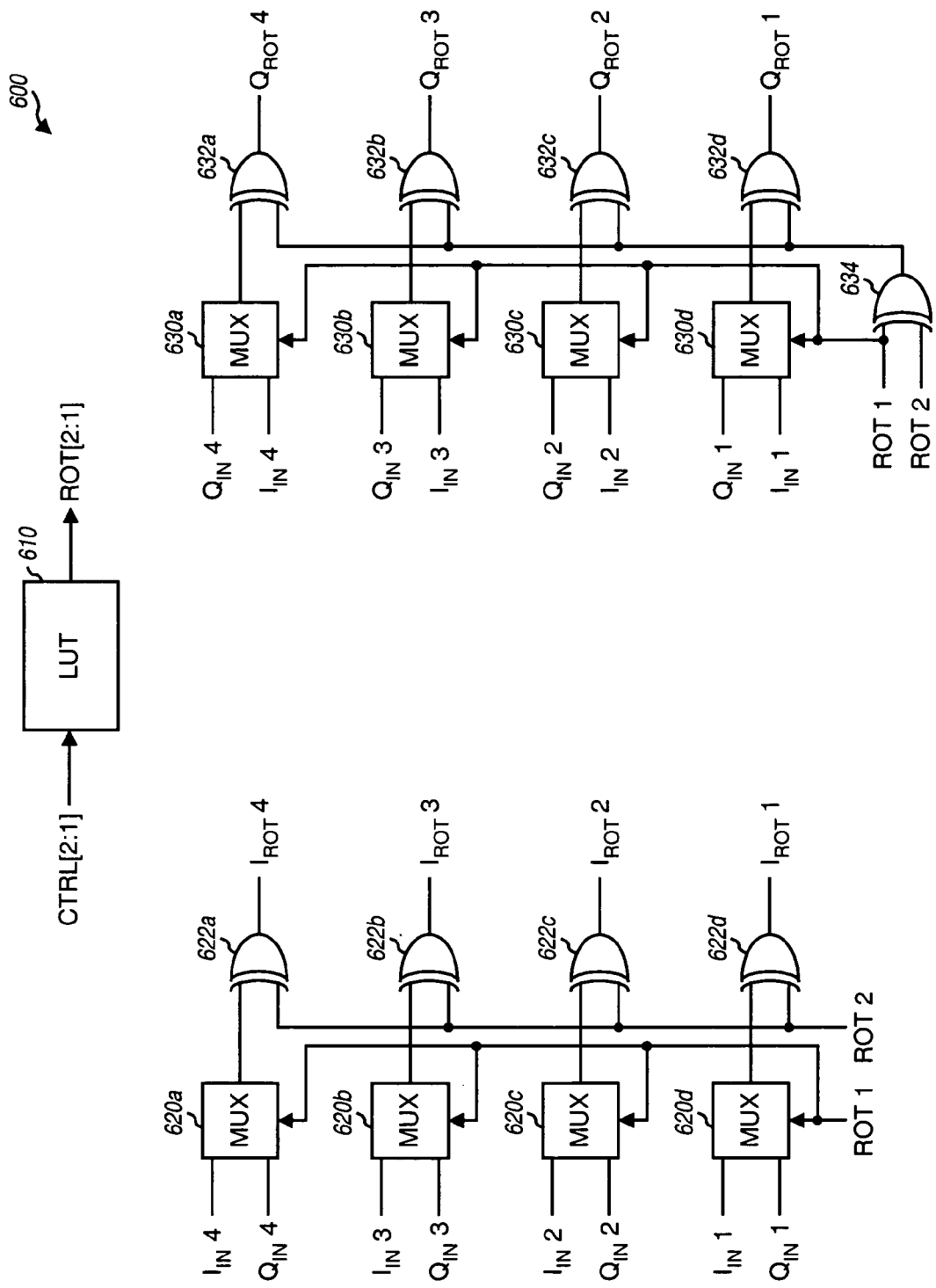
FIG. 6 is a block diagram of a specific embodiment of a phase rotator that can provide phase rotation in 90° increments.

FIG. 6 is a block diagram of a specific embodiment of a phase rotator 600 that can provide phase rotation in 90° increments, as shown in Table 2. Phase rotator 600 can be used as phase rotator 410 in FIG. 4A. In this embodiment, each operating state is associated with one of four possible phase rotations. The control signals CTRL[2:1] identify the particular operating state and the signals ROT[2:1] identify the particular phase rotation. The control signals CTRL[2:1] are provided to a look-up table (LUT) 610 that provides the phase rotation associated with the particular operating state defined by the received control signals CTRL[2:1].

As shown in Table 2, the $I_{ROT}$ and $Q_{ROT}$ samples are equal to the $I_{IN}$ and $Q_{IN}$ samples, respectively, for a phase rotation of zero. For phase rotations of 90° and 270°, the $I_{IN}$ and $Q_{IN}$ samples are swapped. The $I_{ROT}$ samples are inverted for phase rotations of 180° and 270°, and the $Q_{ROT}$ samples are inverted for phase rotations of 90° and 180°. Multiplexers (MUXes) 620 and 630 and exclusive-or (XOR) gates 622, 632, and 634 are used to implement these relationships.

As shown in FIG. 6, to generate the $I_{ROT}$ samples, the $I_{IN}$[4:1] and $Q_{IN}$[4:1] samples are provided to MUXes 620a through 620d that select either the $I_{IN}$ or $Q_{IN}$ samples based on the signal ROT1. As shown in Table 2, the outputs of MUXes 620 comprise the $I_{IN}$ samples when ROT1=0 and comprise the $Q_{IN}$ samples when ROT1=1. The outputs from MUXes 620 are provided to a set of exclusive-or gates 622 that invert the received samples if the signal ROT2=1. The outputs from exclusive-or gates 622 comprise the $I_{ROT}$ samples.

Similarly, to generate the $Q_{ROT}$ samples, the $Q_{IN}$[4:1] and $I_{IN}$[4:1] samples are provided to MUXes 630a through 630d that select either the $Q_{IN}$ or $I_{IN}$ samples based on the signal ROT1. As shown in Table 2, the outputs of MUXes 620 comprise the $Q_{IN}$ samples when ROT1=0 and comprise the $I_{IN}$ samples when ROT1=1. The outputs from MUX 630 are provided to a set of exclusive-or gates 632 that invert the received samples if the control signals ROT1≠ROT2, which is detected by exclusive-or gate 634. The outputs from exclusive-or gates 632 comprise the $Q_{ROT}$ samples.

In the receiver design shown in FIG. 3, two control signals CTRL[2:1] are provided for the two gain blocks in the receive signal path and other control signals are provided for attenuator 346 and VGA 372. Each of control signals CTRL[2:1] controls a respective gain block and has a value of either "0" or "1". Generally, the receive signal path may include any number of gain blocks and any number of adjustable circuit elements. Moreover, any number of signal paths may be coupled in parallel or in series in each gain block and the circuit element can be adjusted to one of any number of states. For example, a gain block can be designed having two or more signal paths and/or discrete gain steps, with each signal path associated with a particular phase.

Figure 7:
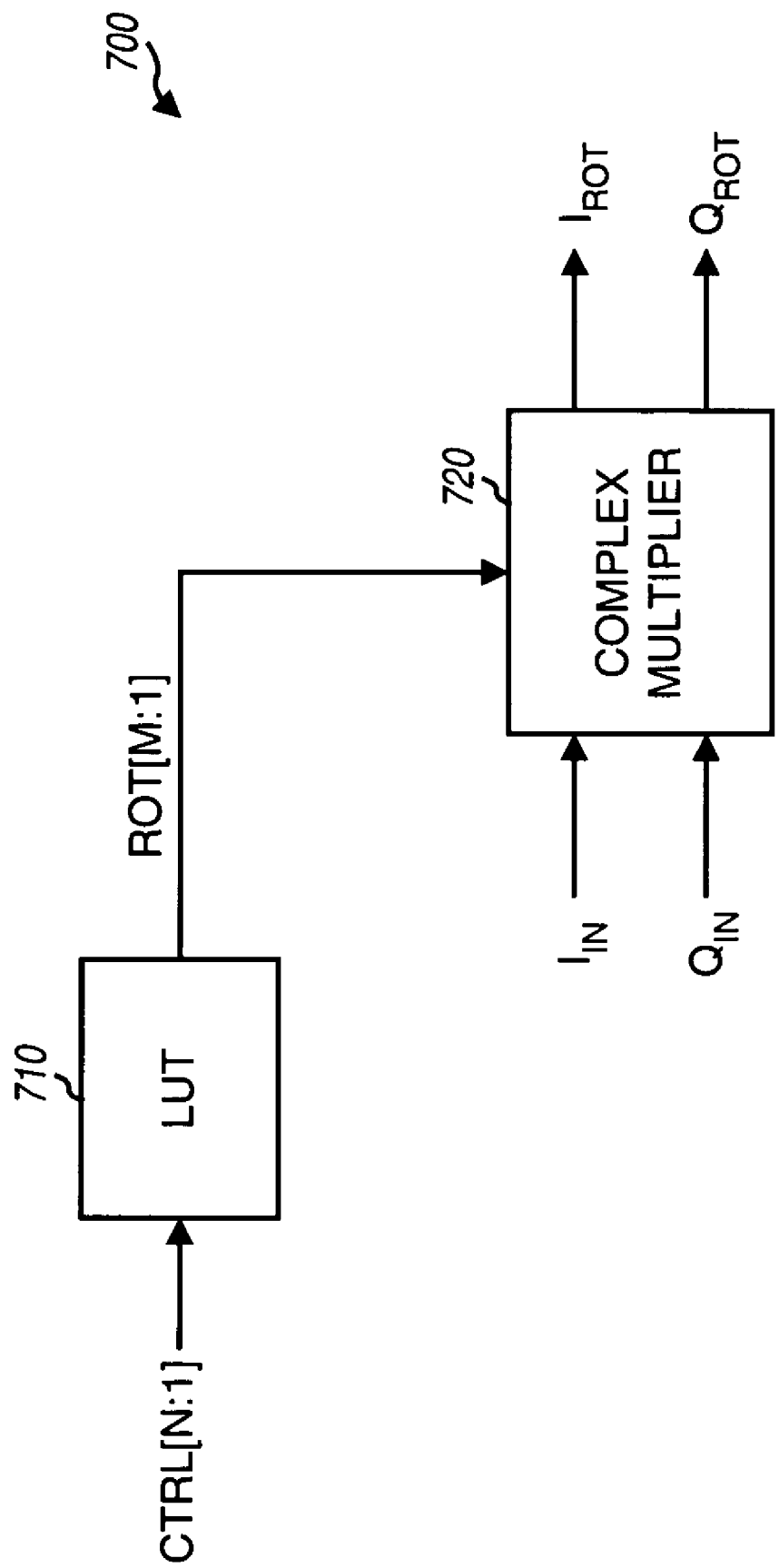
FIG. 7 is a block diagram of an embodiment of a phase rotator that can provide phase rotation in any defined increments.

FIG. 7 is a block diagram of an embodiment of a phase rotator 700 that can provide phase rotation in any defined increments. Phase rotator 700 can also be used as phase rotator 410 in FIG. 4A. In this embodiment, the operating states of the receive signal path are defined by the N-bit control signal CTRL[N:1]. The control signals CTRL[N:1] are provided to a look-up table 710 that provides the phase rotation, $\theta_{ROT}$, associated with the operating state defined by the received control signals CTRL[N:1]. The phase rotation, $\theta_{ROT}$, is identified by the M-bit signals ROT[M:1].

A complex multiplier 720 receives the $I_{IN}$ and $Q_{IN}$ samples and the phase rotation, $\theta_{ROT}$, performs the complex multiply as defined by equations (1) and (2), and provides the phase rotated $I_{ROT}$ and $Q_{ROT}$ samples. Multiplier 720 may further quantize the resultant outputs to provide samples having a particular number of bits of resolution (e.g., 4-bit).

The embodiment of the invention described above compensates for change or discontinuity in the phase of the received signal by performing a phase rotation on the $I_{IN}$ and $Q_{IN}$ samples. This embodiment can be advantageously used in many receiver designs. Referring to FIG. 2, demodulator 248 and decoder 250 and (possibly) control processor 260 may be implemented within an application specific integrated circuit (ASIC) that may be used in various receiver devices by various manufacturers. Each receiver model (or each manufacturer) may be associated with a particular front-end design (e.g., a particular design for receiver 246) having a defined set of control signals that corresponds to a particular set of phase changes/discontinuities. By incorporating the phase rotator within demodulator 248, the ASIC can be used with various front-end designs by simply changing the look-up table that maps the control signals CTRL to the proper phase rotations.

In another embodiment, the phases of the signal paths are equalized such that the phase difference is less than an amount that would cause noticeable performance degradation. For example, referring to FIG. 3, the phase of the bypass path for each gain block can be made comparable or approximately equal to that of the LNA path. The phase equalization can be achieved, for example, by including reactive elements in the bypass path. The reactive elements can be implemented with lumped discrete components, etched components on a printed circuit board, or fabricated elements within an integrated circuit.

In yet another embodiment, the bandwidth of the pilot filter (e.g., lowpass filter 476 in FIG. 4B) can be made adjustable and dependent on the control signal CTRL that direct the switching between signal paths or circuit settings. If the switching between signal paths or circuit settings is expected to cause a large phase change or discontinuity, the bandwidth can be made wide so that the phase change or discontinuity can be reflected at output of the pilot filter after a short time period (e.g., several symbols). Alternatively, for a smaller phase change or discontinuity, the bandwidth can be made moderate so that the smaller phase change or discontinuity can be appropriately tracked. And if no phase changes are expected, the bandwidth can be made narrow for improved filtering of the pilot.

The phase rotation can be performed at any point along the receive signal path (except inside the DC offset correction loops). Referring to FIG. 2, the receive signal path includes the elements from antenna 242 to data sink 252. The received signal typically has different characteristics after each processing block, and the phase rotation can be performed on the received signal at any point in the receive signal path (except inside the DC offset correction loops) by appropriate signal processing. In the embodiment shown in FIG. 4A, phase rotator 410 is shown implemented as a digital phase rotator located at the input of demodulator 400 and after the DC offset correction loops. Referring to FIG. 3, the phase rotation can also be achieved within quadrature downconverter 347, for example, by rotating the carrier signals used to quadrature demodulate the received signal.

In some receiver designs, bandpass sampling is used to generate digitized samples (e.g., baseband or bandpass I and Q samples) that may be further processed to recover the data. For these receiver designs, the phase rotation may be achieved by rotating the digitized samples or the clocks used to digitize the received signal.

A phase rotator that achieves the required functions described above can be implemented using digital or analog circuitry or by software or firmware. In some embodiments, the phase rotation is performed digitally for ease of implementation and to provide consistent performance. The digital implementation allows for phase rotation in discrete steps, although the step size can vary depending on the particular phase rotator design. The phase rotation can also be performed using analog circuitry (e.g., at the quadrature downconversion stage). The analog implementation may allow for phase rotation compensation in a more continuous manner.

The phase rotator of the invention can thus be implemented in various manners. For a digital implementation, the phase rotator can be implemented within a digital signal processor (DSP), an ASIC, a processor, a controller, a look-up table, combinatory logic, or some other circuit elements. The phase rotator can also be implemented in software or firmware executed on a processor.

The invention is particularly applicable for a terminal (i.e., a remote station) of a CDMA system. The terminal is typically required to operate on a received signal having a large range of signal levels (e.g., 85 dB). The terminal may include multiple signal paths and/or multiple circuit elements having variable gains to properly process the received signal.

The invention described herein can be applied to any communications system in which a pilot is sent for coherent demodulation. The invention is applicable to various CDMA systems that currently exist and new systems that are continually being considered, such as CDMA systems that conform to the IS-95, W-CDMA, and CDMA-2000 standards.

The invention can also be applied to other communications systems that employs other modulation techniques such as time division multiple access (TDMA), frequency division multiple access (FDMA), frequency modulation (FM), and amplitude modulation (AM) schemes such as amplitude companded single sideband (ACSSB). The invention can also be applied to other transmission systems such as broadcast television, paging, and others.

The foregoing description of the preferred embodiments is provided to enable any person skilled in the art to make or use the present invention. Various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

What is claimed is:

1. A receiver unit comprising:
   a receiver operative to receive and condition a received signal in accordance with one or more control signals to generate a conditioned signal and operative to downconvert and digitize the conditioned signal to provide inphase ($I_{IN}$) and quadrature ($Q_{IN}$) samples, wherein the receiver includes one or more circuit elements having one or more characteristics that are adjustable by the one or more control signals;
   a controller coupled to the receiver and operative to determine a phase rotation corresponding to an operating state defined by the one or more control signals; and
   a phase rotator coupled to the receiver and operative to receive and rotate a phase of the conditioned signal by an amount related to the determined phase rotation, wherein the phase rotator rotates the phase of the $I_{IN}$ and $Q_{IN}$ samples to generate phase rotated $I_{ROT}$ and $Q_{ROT}$ samples, the phase rotator comprising
   a first set of multiplexers operative to receive the $I_{IN}$ and $Q_{IN}$ samples and to provide the $I_{IN}$ or $Q_{IN}$ samples based on a first signal,
   a first set of exclusive-OR gates coupled to the first set of multiplexers and operative to selectively invert the received samples based on a second signal, wherein outputs of the first set of exclusive-OR gates comprise the $I_{ROT}$ samples,
   a second set of multiplexers operative to receive the $Q_{IN}$ and $I_{IN}$ samples and to provide the $Q_{IN}$ or $I_{IN}$ samples based on the first signal, and
   a second set of exclusive-OR gates coupled to the second set of multiplexers and operative to selectively invert the received samples based on a third signal, wherein outputs of the second set of exclusive-OR gates comprise the $Q_{ROT}$ samples.

2. The receiver unit of claim 1 further comprising:
   a demodulator coupled to the phase rotator and operative to process the $I_{ROT}$ and $Q_{ROT}$ samples to provide pilot symbols and data symbols, and to coherently demodulate the data symbols with the pilot symbols to generate recovered data.

3. The receiver unit of claim 2, wherein the demodulator includes
   a pilot correlator operative to recover the pilot symbols from the $I_{ROT}$ and $Q_{ROT}$ samples,
   a data correlator operative to recover the data symbols from the $I_{ROT}$ and $Q_{ROT}$ samples.

4. The receiver unit of claim 1 wherein the phase rotator is operative to provide phase rotation in discrete increments.

5. The receiver unit of claim 4, wherein the phase rotator is operative to provide phase rotation in 90° increments.

6. The receiver unit of claim 1, wherein the receiver includes
   at least one section comprising a plurality of signal paths, wherein each signal path is associated with a particular phase, and wherein at least one control signal is provided to switch the received signal through one of the signal paths.

7. A phase rotator for use with a receiver and operative to receive and rotate a phase of a conditioned signal output by the receiver by an amount related to the determined phase rotation, wherein the phase rotator rotates the phase of inphase ($I_{IN}$) and quadrature ($Q_{IN}$) samples to generate rotated $I_{ROT}$ and $Q_{ROT}$ samples, comprising:
   a first set of multiplexers operative to receive the $I_{IN}$ and $Q_{IN}$ samples and to provide the $I_{IN}$ or $Q_{IN}$ samples based on a first signal,
   a first set of exclusive-OR gates coupled to the first set of multiplexers and operative to selectively invert the received samples based on a second signal, wherein outputs of the first set of exclusive-OR gates comprise the $I_{ROT}$ samples,
   a second set of multiplexers operative to receive the $Q_{IN}$ and $I_{IN}$ samples and to provide the $Q_{IN}$ or $I_{IN}$ samples based on the first signal, and
   a second set of exclusive-OR gates coupled to the second set of multiplexers and operative to selectively invert the received samples based on a third signal, wherein outputs of the second set of exclusive-OR gates comprise the $Q_{ROT}$ samples.

8. The phase rotator of claim 7, wherein the phase rotator is operative to provide phase rotation in discrete increments.

9. The phase rotator of claim 7, wherein the phase rotator is operative to provide phase rotation in 90° increments.

10. A receiver unit comprising:
   means for receiving and conditioning a received signal in accordance with one or more control signals to generate a conditioned signal and operative to downconvert and digitize the conditioned signal to provide inphase ($I_{IN}$) and quadrature ($Q_{IN}$) samples, wherein the means for receiving and conditioning comprises one or more circuit elements having one or more characteristics that are adjustable by the one or more control signals;
   means for controlling coupled to the means of receiving and conditioning, the means for controlling being operative to determine a phase rotation corresponding to an operating state defined by the one or more control signals; and
   means for phase rotating coupled to the receiver and operative to receive and rotate a phase of the conditioned signal by an amount related to the determined phase rotation, wherein the phase rotator rotates the phase of the $I_{IN}$ and $Q_{IN}$ samples to generate phase rotated $I_{ROT}$ and $Q_{ROT}$ samples, the means for phase rotating comprising
      first means for multiplexing operative to receive the $I_{IN}$ and $Q_{IN}$ samples and to provide the $I_{IN}$ or $Q_{IN}$ samples based on a first signal,
      first means for selectively inverting the received samples based on a second signal and outputting $I_{ROT}$ samples,
      second means for multiplexing operative to receive the $Q_{IN}$ and $I_{IN}$ samples and to provide the $Q_{IN}$ or $I_{IN}$ samples based on the first signal, and
      second means for selectively inverting the received samples based on a third signal and for outputting the $Q_{ROT}$ samples.

11. The receiver unit of claim 10, further comprising:
   a means for demodulating coupled to the means for phase rotating and operative to process the $I_{ROT}$ and $Q_{ROT}$ samples to provide pilot symbols and data symbols, and to coherently demodulate the data symbols with the pilot symbols to generate recovered data.

12. The receiver unit of claim 11, wherein the means for demodulating includes
   a means for correlating pilot symbols operative to recover the pilot symbols from the $I_{ROT}$ and $Q_{ROT}$ samples, and
   a means for correlating data symbols operative to recover the data symbols from the $I_{ROT}$ and $Q_{ROT}$ samples.

13. The receiver unit of claim 10, wherein the receiver includes
   at least one section comprising a plurality of signal paths, wherein each signal path is associated with a particular phase, and wherein at least one control signal is provided to switch the received signal through one of the signal paths.

14. The receiver unit of claim 10, wherein the means for phase rotating is operative to provide phase rotation in discrete increments.

15. The receiver unit of claim 14, wherein the means for phase rotating is operative to provide phase rotation in 90° increments.

16. A method of receiving comprising:
   receiving and conditioning a received signal in accordance with one or more control signals to generate a conditioned signal and downconverting and digitizing the conditioned signal to provide inphase ($I_{IN}$) and quadrature ($Q_{IN}$) samples, wherein the receiving includes the one or more control signals adjusting one or more characteristics in one or more circuit elements;
   determining a phase rotation corresponding to an operating state defined by the one or more control signals; and
   receiving and rotating a phase of the conditioned signal by an amount related to the determined phase rotation, wherein the phase rotating the phase of the $I_{IN}$ and $Q_{IN}$ samples generating phase rotated $I_{ROT}$ and $Q_{ROT}$ samples, the phase rotating comprising
   receiving the $I_{IN}$ and $Q_{IN}$ samples and providing the $I_{IN}$ or $Q_{IN}$ samples based on a first signal,
   selectively inverting the received samples based on a second signal, wherein outputs of a first set of exclusive-OR gates comprise the $I_{ROT}$ samples,
   a second set of multiplexers receiving the $Q_{IN}$ and $I_{IN}$ samples and providing the $Q_{IN}$ or $I_{IN}$ samples based on the first signal, and
   selectively inverting the received samples based on a third signal, wherein outputs of a second set of exclusive-OR gates comprise the $Q_{ROT}$ samples.

17. The method of claim 16, further comprising:
   demodulating the $I_{ROT}$ and $Q_{ROT}$ samples to provide pilot symbols and data symbols, and coherently demodulating the data symbols with the pilot symbols to generate recovered data.

18. The method of claim 17, wherein the demodulating includes
   pilot correlating to recover the pilot symbols from the $I_{ROT}$ and $Q_{ROT}$ samples, and
   data correlating to recover the data symbols from the $I_{ROT}$ and $Q_{ROT}$ samples.

19. The method of claim 16, wherein the method further includes
   associating each of a plurality of signal paths with a particular phase, and
   switching the received signal through one of the signal paths.

20. The method of claim 16, wherein the phase rotating is providing phase rotation in discrete increments.

21. The method of claim 20, wherein the phase rotating is providing phase rotation in 90° increments.

* * * * *